United States Patent
Wang et al.

(10) Patent No.: US 11,382,243 B1
(45) Date of Patent: Jul. 5, 2022

(54) DISPLAY APPARATUSES

(71) Applicant: DYNASCAN TECHNOLOGY CORP., Taoyuan (TW)

(72) Inventors: Tsun-I Wang, Taoyuan (TW);
Ching-Chun Wu, Taoyuan (TW);
Chia-Liang Yang, Taoyuan (TW);
Chih-Hao Kang, Taoyuan (TW)

(73) Assignee: DYNASCAN TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 17/137,024

(22) Filed: Dec. 29, 2020

(51) Int. Cl.
*H05K 7/20* (2006.01)
*B08B 9/032* (2006.01)
*F28G 1/16* (2006.01)

(52) U.S. Cl.
CPC ......... *H05K 7/20972* (2013.01); *B08B 9/032* (2013.01); *F28G 1/166* (2013.01); *H05K 7/202* (2013.01)

(58) Field of Classification Search
CPC ...... H05K 7/20972; B08B 9/032–0328; F28G 1/166
See application file for complete search history.

(56) References Cited

U.S. PATENT DOCUMENTS

| | | | |
|---|---|---|---|
| 1,786,182 A * | 12/1930 | Whiton, Jr. | F28G 1/163 165/95 |
| 3,364,983 A * | 1/1968 | Mas | F28G 7/00 165/84 |
| 4,366,003 A * | 12/1982 | Korte | F28G 9/00 134/18 |
| 4,562,885 A * | 1/1986 | Pausch | F28G 1/166 15/318.1 |
| 5,499,639 A * | 3/1996 | Williams, Jr. | B08B 9/0321 134/167 C |
| 5,664,992 A * | 9/1997 | Williams, Jr. | B24C 3/325 451/61 |
| 7,789,966 B2 * | 9/2010 | Kramer | F28G 1/163 134/8 |
| 8,693,185 B2 * | 4/2014 | Dunn | H05K 7/20154 361/679.48 |
| 9,594,271 B2 * | 3/2017 | Dunn | G02F 1/0105 |
| 10,420,257 B2 * | 9/2019 | Dunn | H05K 7/20154 |
| 10,754,184 B2 * | 8/2020 | Wang | G02F 1/133385 |

(Continued)

FOREIGN PATENT DOCUMENTS

CN 108174587 A * 6/2018
CN 212990550 U * 4/2021

*Primary Examiner* — Robert J Hoffberg
(74) *Attorney, Agent, or Firm* — Duane Morris LLP

(57) ABSTRACT

A display apparatus is provided. The display apparatus comprises an electronic display assembly, a heat exchanger, a fan, and a cleaning device. The heat exchanger comprises one or more internal heat dissipation pathways and one or more external heat dissipation pathways. The one or more internal heat dissipation pathways are thermally coupled to the electronic display assembly and the one or more internal heat dissipation pathways are thermally coupled to the one or more external heat dissipation pathways. The fan generates ambient air flow passing through the one or more external heat dissipation pathways. The cleaning device is connected to the one or more external heat dissipation pathways, and used for injecting a cleaning fluid into the one or more external heat dissipation pathways.

16 Claims, 7 Drawing Sheets

(56) References Cited

U.S. PATENT DOCUMENTS

| | | | |
|---|---|---|---|
| 2012/0000491 A1* | 1/2012 | Jakes | B08B 5/02 15/406 |
| 2020/0080799 A1* | 3/2020 | Johns | F28D 9/0062 |
| 2021/0165472 A1* | 6/2021 | Chin | H05K 7/20972 |
| 2021/0170455 A1* | 6/2021 | Kleinvachter | B08B 9/0328 |
| 2021/0307214 A1* | 9/2021 | Zhang | H05K 7/20963 |

* cited by examiner

DISPLAY APPARATUSES

BACKGROUND

1. Field of the Disclosure

The present disclosure relates to display apparatuses. More particularly, the present disclosure relates to display apparatuses with a cleaning device.

2. Description of the Related Art

As display apparatuses are widely used in different environments, ensuring reliability and robustness under harsh conditions has become an important issue. For example, if a display apparatus is placed outdoors, vehicle exhaust, dust and/or dirt in the ambient air may contaminate the air pathways of the display apparatus. If the air pathways of the outdoor display apparatus are not cleaned frequently, the heat dissipation efficiency of the outdoor display apparatus may be reduced, which may cause the display apparatus to overheat and be damaged.

Such an outdoor display apparatus requires regular maintenance because the air pathways have to be cleaned. However, the maintenance of an outdoor display apparatus is quite expensive and time-consuming. Additionally, if the outdoor display apparatus is installed at a high position (for example, the outer wall of a building, etc.), the manual operation of cleaning the air pathways or the display apparatus may be very dangerous.

SUMMARY

In light of the above, there is a need for a display apparatus equipped with a cleaning device, which may automatically clean the display apparatus to extend the service life of the display device and to save time, money and labor required to maintain the display device.

In one aspect according to some embodiments of the present disclosure, a display apparatus is provided. The display apparatus comprises an electronic display assembly, a heat exchanger, a fan, and a cleaning device. The heat exchanger comprises one or more internal heat dissipation pathways and one or more external heat dissipation pathways. The one or more internal heat dissipation pathways are thermally coupled to the electronic display assembly and the one or more internal heat dissipation pathways are thermally coupled to the one or more external heat dissipation pathways. The fan generates ambient air flow passing through the one or more external heat dissipation pathways. The cleaning device is connected to the one or more external heat dissipation pathways, and used for injecting a cleaning fluid into the one or more external heat dissipation pathways.

In a preferred embodiment, the cleaning device comprises an inlet for receiving the cleaning fluid, a pipe, and a plurality of outlets on the pipe connected to the one or more external heat dissipation pathways.

In a preferred embodiment, the cleaning device is disposed on a back side of the electronic display assembly opposite to a viewing side of the electronic display assembly.

In a preferred embodiment, the cleaning fluid comprises liquid or gas.

In a preferred embodiment, the display apparatus comprises a cleaning fluid tank connected to the inlet of the cleaning device.

In a preferred embodiment, the display apparatus comprises a control unit configured to release the cleaning fluid from the cleaning fluid tank to the cleaning device.

In a preferred embodiment, the control unit is configured to release the cleaning fluid from the cleaning fluid tank to the cleaning device when the display apparatus is turned on.

In a preferred embodiment, the control unit is configured to release the cleaning fluid from the cleaning fluid tank to the cleaning device when the display apparatus is turned off.

In a preferred embodiment, the display apparatus comprises a locking accessory for mounting the cleaning device to the electronic display assembly.

In one aspect according to some embodiments of the present disclosure, a display apparatus is provided. The display apparatus comprises a first electronic display assembly, a first heat exchanger, a fan, and a cleaning device. The first heat exchanger is thermally coupled to the first electronic display assembly and has a first heat dissipation pathway. The fan generates air flow passing through the first heat dissipation pathway. The cleaning device has an inlet and a pipe. The inlet is used for receiving a cleaning fluid. The pipe is connected to the first heat dissipation pathway and used for injecting the cleaning fluid into the first heat dissipation pathway.

In a preferred embodiment, the first heat exchanger comprises a plurality of first heat dissipation pathways. The cleaning device comprises a plurality of first outlets on the pipe connected to the plurality of first heat dissipation pathways.

In a preferred embodiment, the display apparatus comprises a second electronic display assembly and a second heat exchanger. The second heat exchanger is thermally coupled to the second electronic display assembly and has a second heat dissipation pathway. The pipe of the cleaning device is connected to the second heat dissipation pathway.

Other aspects and embodiments of the present disclosure are also contemplated. The foregoing summary and the following detailed description are not meant to limit the present disclosure to any particular embodiment but are merely meant to describe some embodiments of the present disclosure.

BRIEF DESCRIPTION OF THE DRAWINGS

For a better understanding of the nature and objects of some embodiments of the present disclosure, reference should be made to the following detailed description taken in conjunction with the accompanying drawings. In the drawings, identical or functionally identical elements are given the same reference numbers unless otherwise specified.

DETAILED DESCRIPTION

The present disclosure provides a display apparatus and a double-sided display apparatus with a cleaning device. According to some embodiments of the present disclosure, the cleaning device can be controlled manually, automatically, and/or remotely. According to some embodiments of the present disclosure, the cleaning device can be activated without affecting the playback of the display apparatus. According to some embodiments of the present disclosure, the cleaning device can achieve the functions of cleaning the filter and reducing the temperature of the display apparatus.

Figure 1:
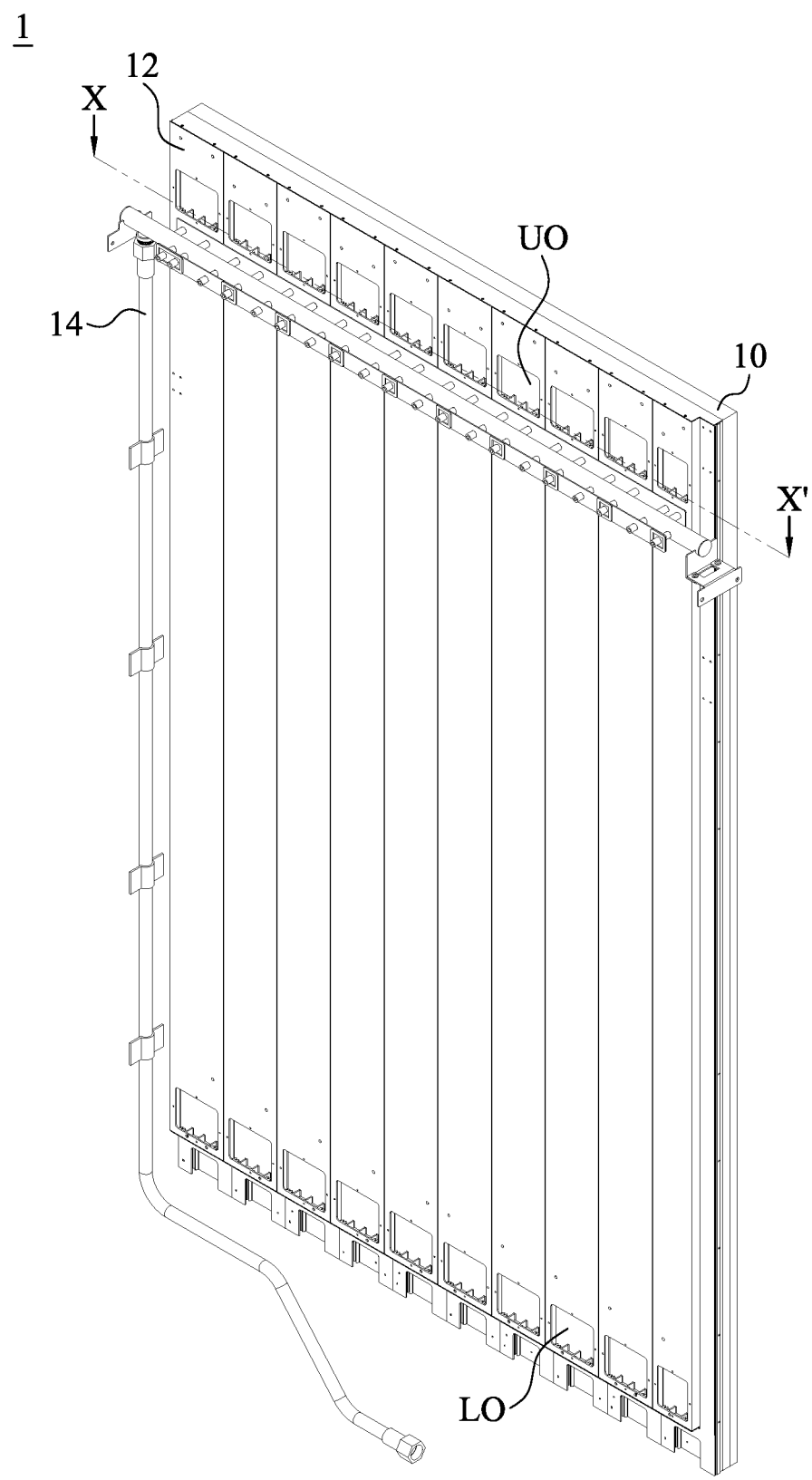
FIG. 1 is a stereoscopic diagram of a display apparatus according to some embodiments of the present disclosure.

FIG. 1 is a stereoscopic diagram of a display apparatus according to some embodiments of the present disclosure. Referring to FIG. 1, a display apparatus 1 includes an electronic display assembly 10, a heat exchanger 12, and a cleaning device 14. The heat exchanger 12 is thermally connected to the electronic display assembly 10 for dissipating the heat generated by the electronic display assembly 10. The cleaning device 14 is attached to the heat exchanger for cleaning the heat exchanger. In some embodiments, the cleaning device can be used to cool the heat exchanger 12 and the electronic display assembly 10 during cleaning.

Figure 2:
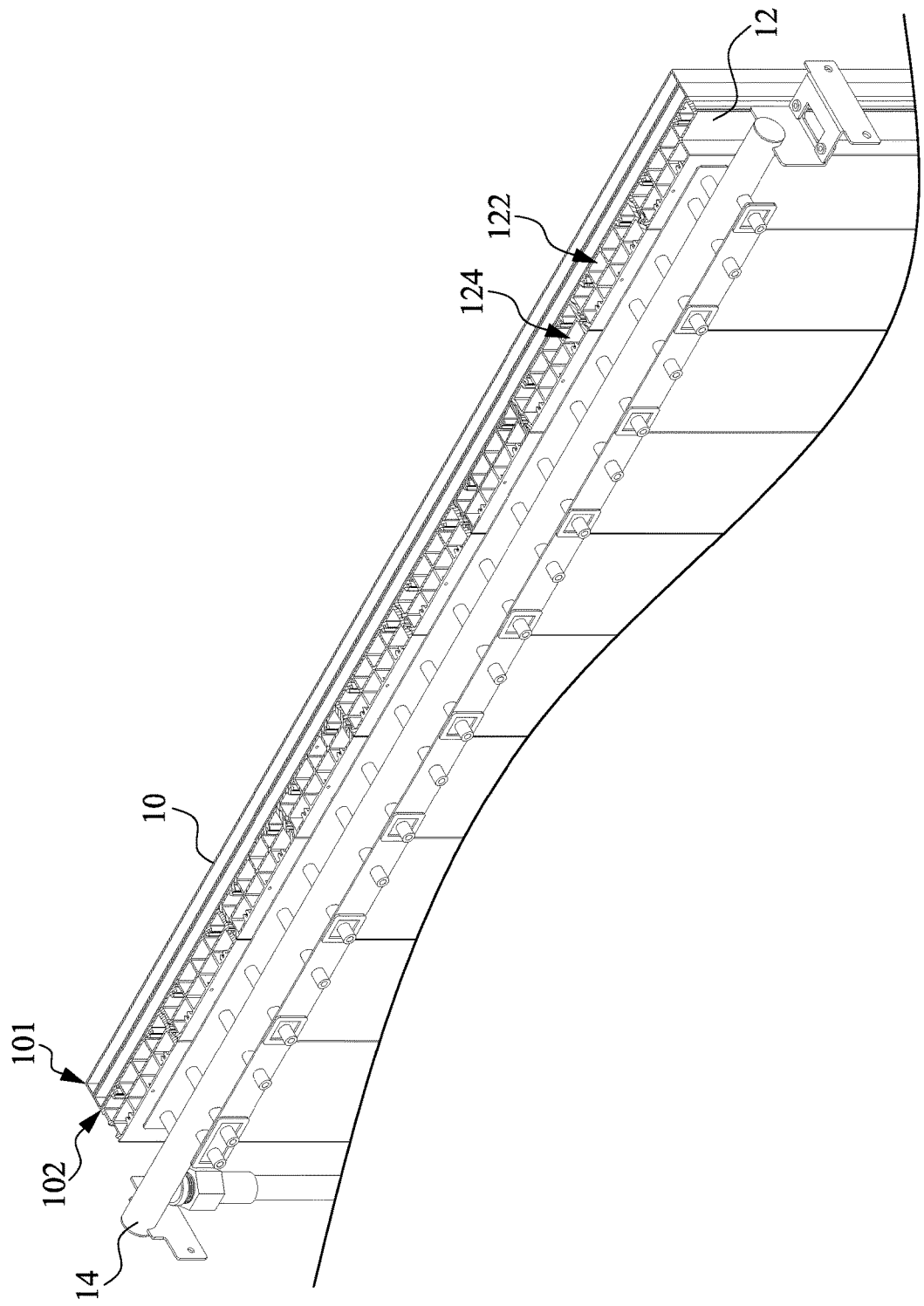
FIG. 2 illustrates a enlarged view showing cross section of the display apparatus of FIG. 1 taken along line x-x'.

FIG. 2 illustrates an enlarged view showing a cross section of the display apparatus of FIG. 1 taken along line x-x'. The electronic display assembly 10 has a viewing side 101 and back side 102 opposite to the viewing side 101. The back side 102 of the electronic display assembly 10 is attached to the front side of the heat exchanger 12. The cleaning device 14 is mounted on the back side of the heat exchanger 12 via locking accessory or a fixing frame. The cleaning device 14 is, for example, detachably fixed to the back side of the heat exchanger 12. Please refer to FIG. 1 again. There are a plurality of upper openings UO and lower openings LO on the back side of the heat exchanger 12.

According to some embodiments of the present disclosure, the electronic display assembly 10 is, for example, a liquid crystal display with a direct LED backlight module. The electronic display assembly 10 may include a transparent plate, a liquid crystal panel, a backlight module, and so on. Please note that a liquid crystal display with an edge-lit backlight module or an OLED display without the backlight module can also be used in the subsequent embodiments, which is not limited herein.

The heat exchanger 12 includes a plurality of internal heat dissipation pathways 122 and a plurality of external heat dissipation pathways 124. The plurality of internal heat dissipation pathways 122 are thermally coupled to the electronic display assembly 10. According to some embodiments of the present disclosure, the internal heat dissipation pathways 122 are fluidly connected with an accommodation space within the electronic display assembly 10. Therefore, the high temperature air flow in the electronic display assembly 10 can be transferred to the plurality of internal heat dissipation pathways 122 of the heat exchanger 12.

The plurality of external heat dissipation pathways 124 are thermally coupled to the plurality of internal heat dissipation pathways 122. The external heat dissipation pathways 124 are fluidly connected with the external environment. According to some embodiments of the present disclosure, a fan may be disposed within the display apparatus 1 to generate ambient air flow passing through the external heat dissipation pathways 124. In some embodiments, the fan may be disposed within the external heat dissipation pathways 124. It is worth noting that any air flow in the internal heat dissipation pathways 122 is independent from the ambient air flow in the external heat dissipation pathways 124. In some embodiments, any air flow in the internal heat dissipation pathways 122 may be isolated from the ambient air flow in the external heat dissipation pathways 124.

The heat exchanger 12, for example, is made of heat-conductive materials (e.g., metallic materials). Therefore, if the temperature in the internal heat dissipation pathways 122 is higher than that in the external heat dissipation pathways 124, the heat will be transferred from the internal heat dissipation pathways 122 to the external heat dissipation pathways 124 through the metal plate/metallic materials between the internal heat dissipation pathways 122 and the external heat dissipation pathways 124.

The cleaning device 14 is disposed on a back side 102 of the electronic display assembly 10 opposite to a viewing side 101 of the electronic display assembly 10. Specifically, the cleaning device 14 is installed on the back side of the heat exchanger 12. The cleaning device 14 is connected to the plurality of external heat dissipation pathways 124, and used for injecting a cleaning fluid into the plurality of external heat dissipation pathways 124.

Figure 3A:
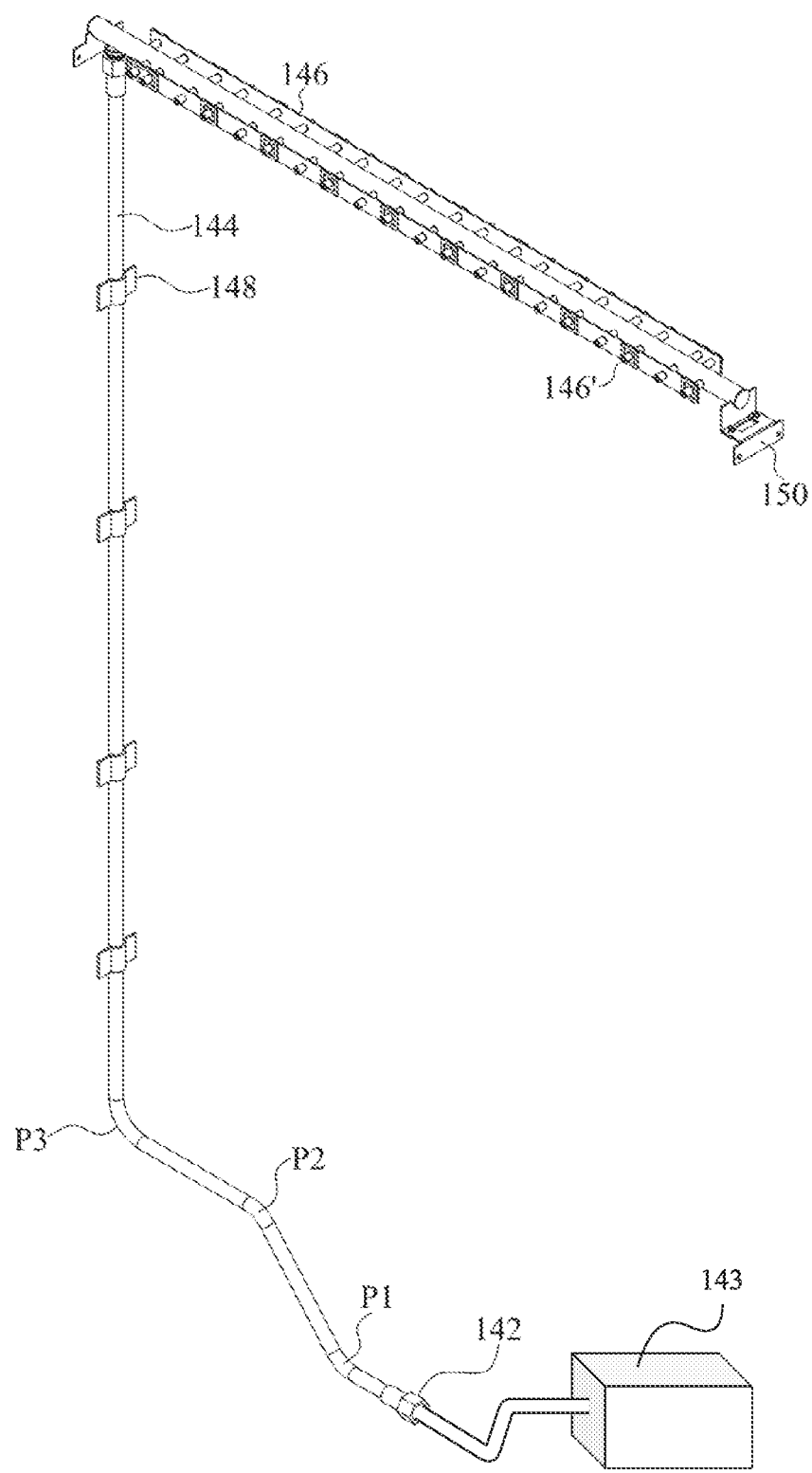
FIG. 3A is a diagram illustrating a cleaning device according to some embodiments of the present disclosure.

FIG. 3A is a diagram illustrating a cleaning device according to some embodiments of the present disclosure. Referring to FIG. 1 to FIG. 3A, the cleaning device 14 includes at least one inlet 142, a pipe 144 and a plurality of outlets 146 and 146'. The cleaning device 14 is, for example, detachably fixed to the back side of the heat exchanger 12 via locking accessories 148 and 150.

The inlet 142 is used for receiving the cleaning fluid. The cleaning fluid includes liquid or gas. For example, the cleaning fluid may be water and/or a cleaning agent containing foam materials, which is not limited here. In some embodiments, the inlet 142 of the cleaning device 14 can be connected to one or more cleaning fluid tanks 143. The water and/or cleaning agent can be stored in the one or more cleaning fluid tanks 143 in advance.

Figure 3B:
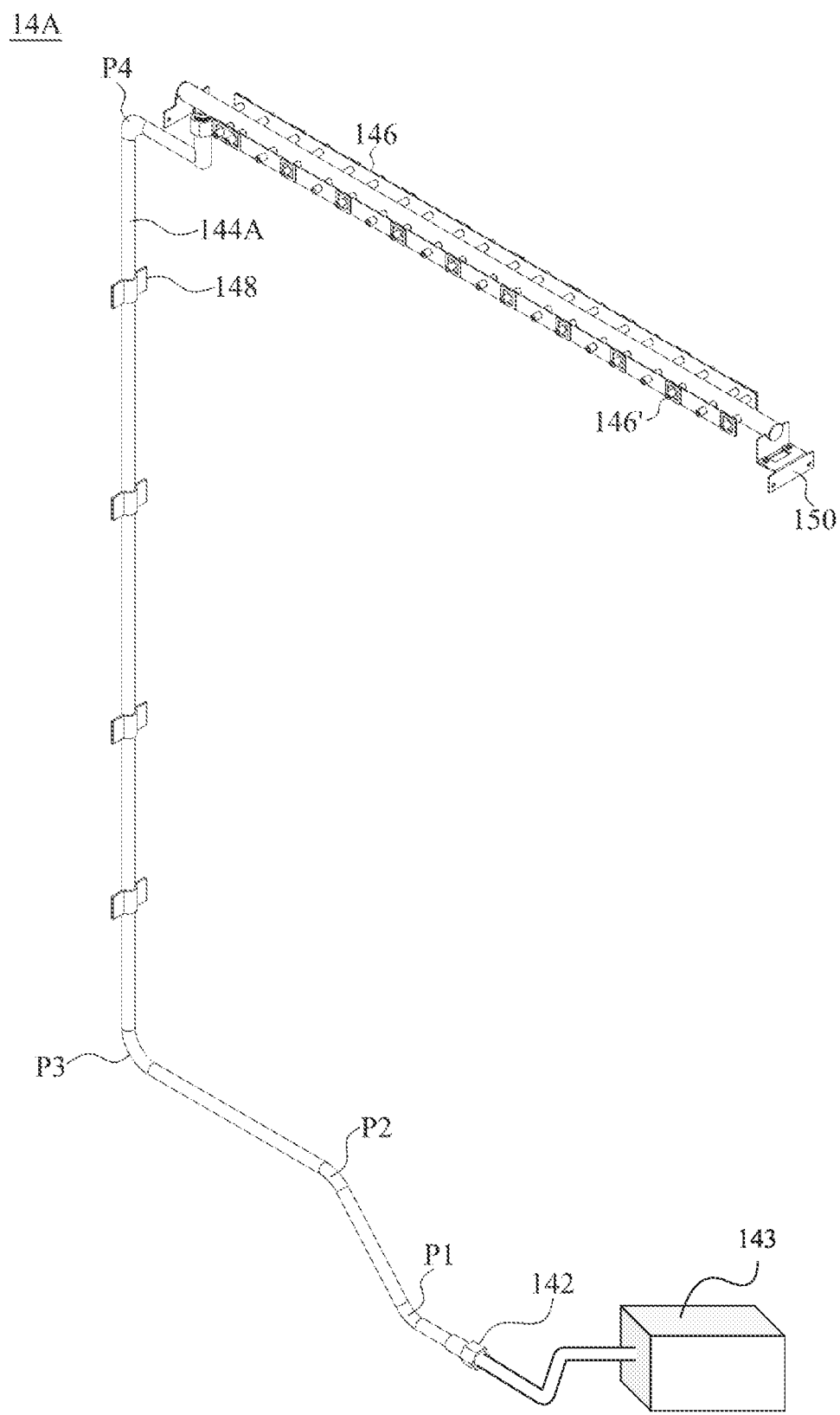
FIG. 3B is a diagram illustrating a cleaning device according to some embodiments of the present disclosure.

The cleaning fluid is transported to the plurality of outlets 146, 146' via the pipe 144. In this embodiment, the pipe 144 has bending portions P1, P2, and P3. It should be noted that the shape, length, material, and diameter of the pipe can be designed based on situational needs, and thus is not limited here. FIG. 3B is a diagram illustrating another example of the cleaning device according to some embodiments of the present disclosure. The cleaning device 14A of FIG. 3B is similar to the cleaning device 14 of FIG. 3A, and the difference between them merely lies in that the pipe 144A of the cleaning device 14A has bending portions P1, P2, P3, and P4. The cleaning device 14A of FIG. 3B is also applicable to the display apparatus 1 of FIG. 1 or other display apparatuses in the subsequent embodiments.

The plurality of outlets 146 on the pipe 144/144A are connected to the plurality of external heat dissipation pathways 124 of the heat exchanger 12. Therefore, the cleaning fluid can be injected into the plurality of external heat dissipation pathways 124 and rinse the external heat dissipation pathways 124 from top to bottom such that the dust and/or dirt attached to the air filter within the external heat dissipation pathways 124 can be washed away. The cleaning fluid can flow out from the lower openings LO on the back side of the heat exchanger 12.

The cleaning fluid flushes the external heat dissipation pathways 124, which can quickly cool external heat dissipation pathways 124. Due to the thermal conduction of the heat exchanger 12, the heat in the internal heat dissipation pathways 122 can be conducted to the external heat dissipation pathways 124, thereby reducing the temperature inside the electronic display assembly 10. Hence, according to some embodiments of the present disclosure, the cleaning fluid can be used as medium for dissipating heat in the external heat dissipation pathways 124, and thus the cleaning device 14 of FIG. 3A and the cleaning device 14A of FIG. 3B have both cleaning and cooling effects.

Since the internal heat dissipation pathways 122 and the external heat dissipation pathways 124 are independent or isolated from each other, the cleaning fluid cannot flow into the internal heat dissipation pathways 122 or the electronic display assembly 10, thereby protecting the electronic display assembly 10 from damage and not affecting the operation of the electronic display assembly 10. Therefore, the cleaning device 14/14A can operate when the display apparatus is turned on.

Figure 4:
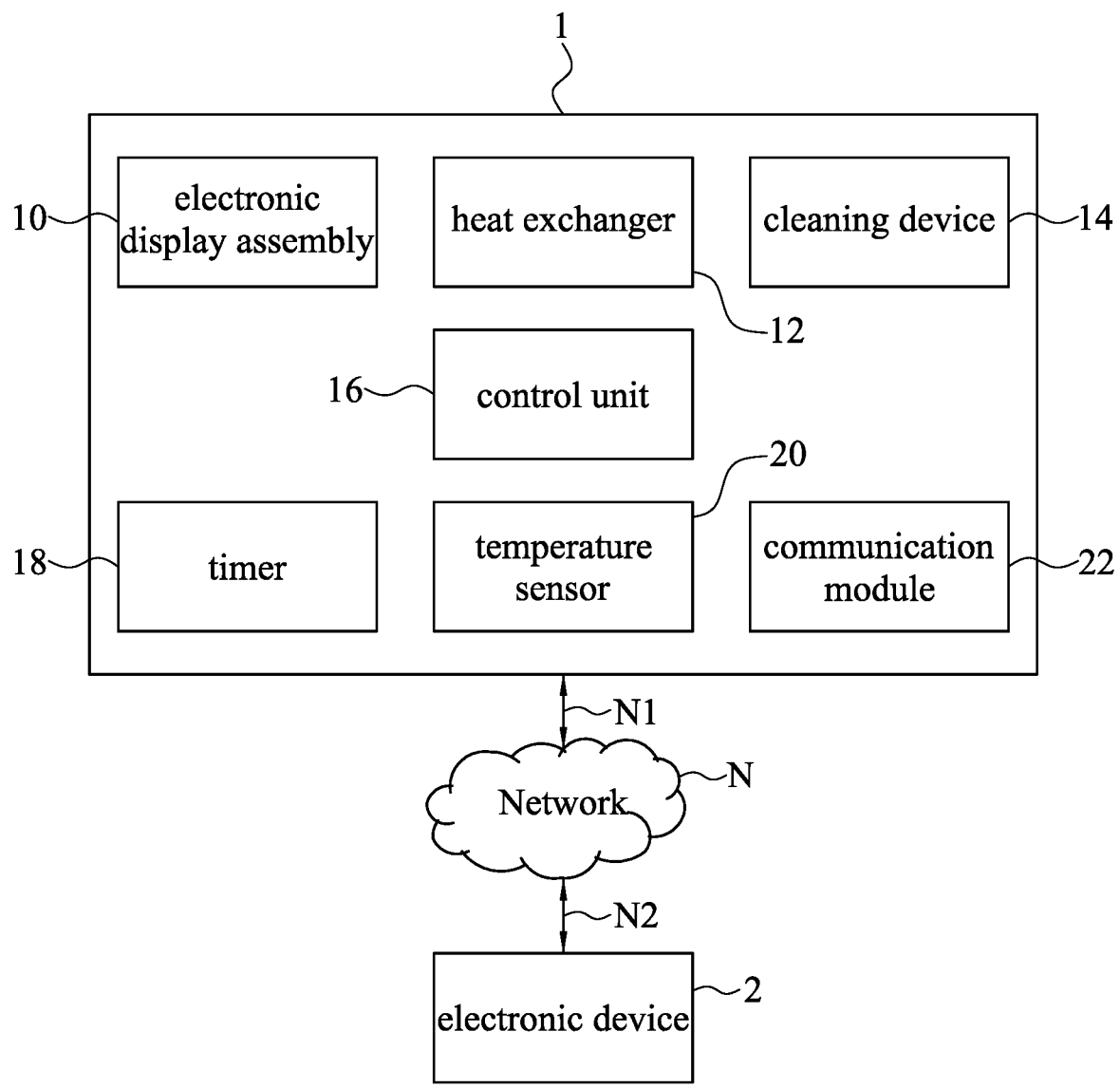
FIG. 4 is a functional block diagram showing the components for an exemplary embodiment of the display apparatus.

FIG. 4 is a functional block diagram showing the components for an exemplary embodiment of the display apparatus. According to some embodiments of the present disclosure, the display apparatus 1 includes an electronic display assembly 10, a heat exchanger 12, and a cleaning device 14. According to some embodiments of the present disclosure, the display apparatus 1 may further include a control unit 16, a timer 18, a temperature sensor 20, a communication module 22, or a combination of one or more thereof.

In some embodiments, the control unit 16 is configured to activate the cleaning device 14 (i.e., release the cleaning fluid from the cleaning fluid tank 143 to the cleaning device 14) when the electronic display assembly 10 is turned on. In some embodiments, the control unit 16 is configured to activate the cleaning device 14 when the electronic display assembly 10 is turned off. Whether or not the electronic display assembly 10 is displaying an image and/or video content, the cleaning behavior of the cleaning device 14 will not affect the operation of the electronic display assembly 10.

In some embodiments, the control unit 16 can automatically and periodically activate the cleaning device 14 according to the setting of the timer 18. For example, the control unit 16 can activate the cleaning device 14 every week or every month based on situational needs. Specifically, the number of cleanings and periodic settings are related to the environment where the display apparatus 1 is placed.

In some embodiments, the control unit 16 can activate the cleaning device 14 according to the temperature measured by the temperature sensor 20. For example, the temperature sensor 20 is appropriately disposed within the display apparatus 1. The temperature sensor 20 may be used to detect the temperature of the liquid crystal panel of the electronic display assembly 10. The control unit 16 can automatically activate the cleaning device 14 when the measured temperature is higher than a predetermined threshold. Due to the activation of the cleaning device 14, the heat in the internal heat dissipation pathways 122 of the heat exchanger 12 can be rapidly absorbed by the cleaning fluid in the external heat dissipation pathways 124 of the heat exchanger 12, thereby avoiding damage to the display apparatus 1 due to high temperatures.

In some other embodiments, the temperature sensor 20 is disposed out of the display apparatus 1 for sensing temperature of the environment. When the measured temperature is higher than a predetermined threshold, it is considered that the ambient air may not be cool enough for heat dissipation. The control unit 16 can automatically activate the cleaning device 14 when the measured temperature is higher than the predetermined threshold. By doing so, the heat accumulated in the display apparatus 1 can be transferred to the cleaning fluid, and driven out the external heat dissipation pathways 124.

According to some embodiments of the present disclosure, the display apparatus 1 may further includes a communication module 22. The communication module 22 is electrically connected to the control unit 16. The communication module 22 can include wired and/or wireless components which provide connection to network N, such that the display apparatus 1 can communicate with an external electronic device 2. Network links N1 and N2 can be wired or wireless. Network N can be, for example, a wireless communication network, a cellular telephone network, a Long Term Evolution (LTE) network, a 3GPP-based network, a 3GPP 5G network, New Radio (NR) network, Internet-of-Things (IoT) network, Narrow Band Internet of Things (NB-IoT) network, non-cellular (e.g., WiFi or WiMax) IP network, and/or other communications networks. The external electronic device 2 can be, for example, a mobile phone, a tablet, a notebook, a desktop, or some other electronic device having a screen, and is used for receiving data from the display apparatus 1.

In some embodiments, the communication module 22 is used for receiving the measured temperature information directly from the temperature sensor 20 or through the control unit 16. The communication module 22 of the display apparatus 1 transmits the measured temperature information to the external electronic device 2 via the network N. The external electronic device 2 shows the measured temperature on a screen such that a user of the electronic device 2 (e.g., the administrator or owner of the display apparatus 1) can determine whether the measured temperature of the electronic display assembly 10 is in the normal range or whether the measured temperature of the electronic display assembly 10 is too high. If the user determines that the temperature within the display apparatus 1 should be lowered, then he/she can set one or more parameters using the software application on the external electronic device 2. The parameters can be, for example, the operation mode (e.g., turned-on mode or turned-off mode) of the cleaning device 14. Then, the external electronic device 2 transmits the parameters and/or other control signals to the communication module 22 of display apparatus 1 via the network N. The communication module 22 receives the parameters and/or control signals and transmits them to the control unit 16 such that the control unit 16 can drive/control the operations of the cleaning device 14.

Figure 5A:
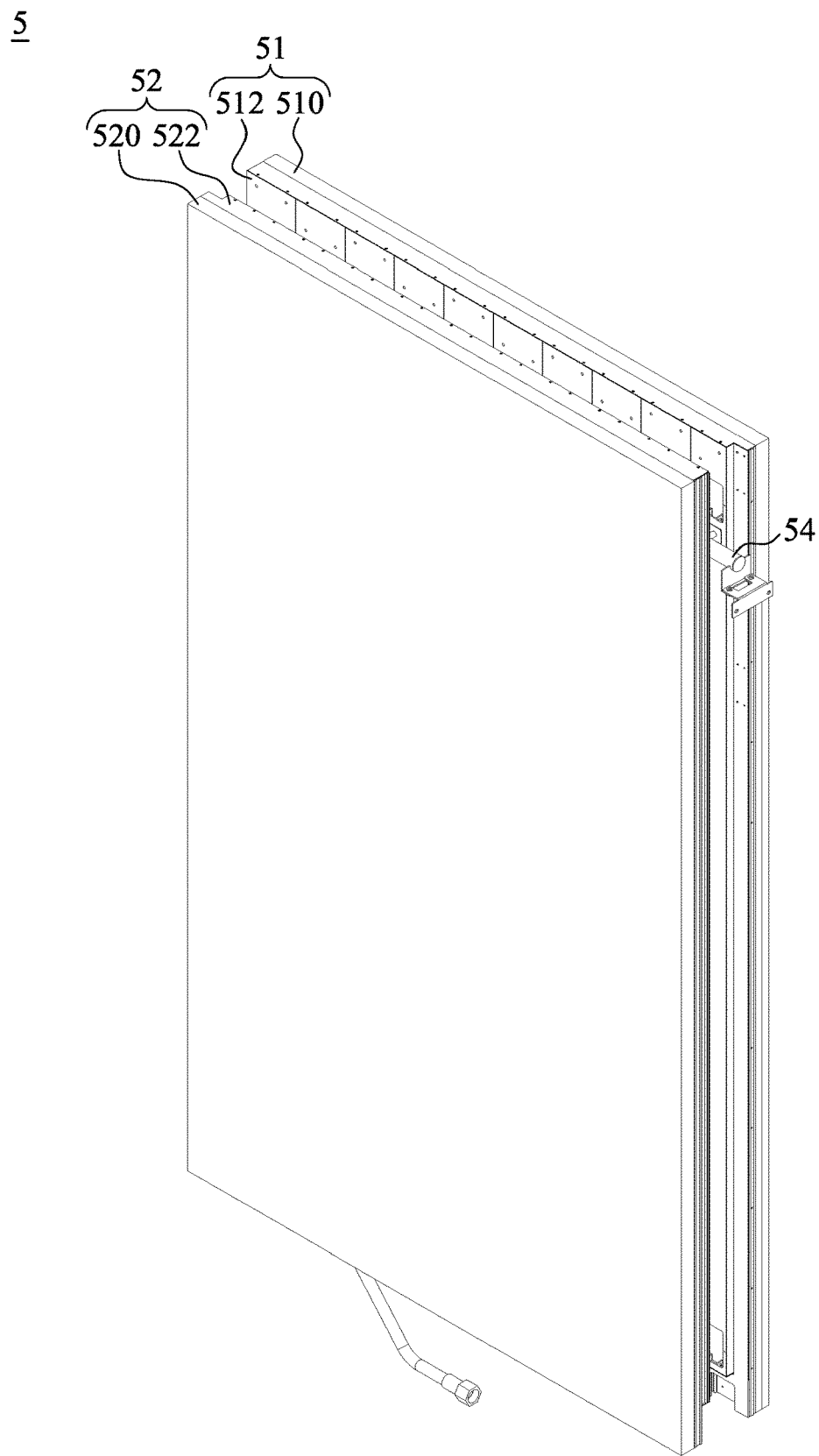
FIG. 5A is a stereoscopic diagram of a double-sided display apparatus according to some embodiments of the present disclosure.
Figure 5B:
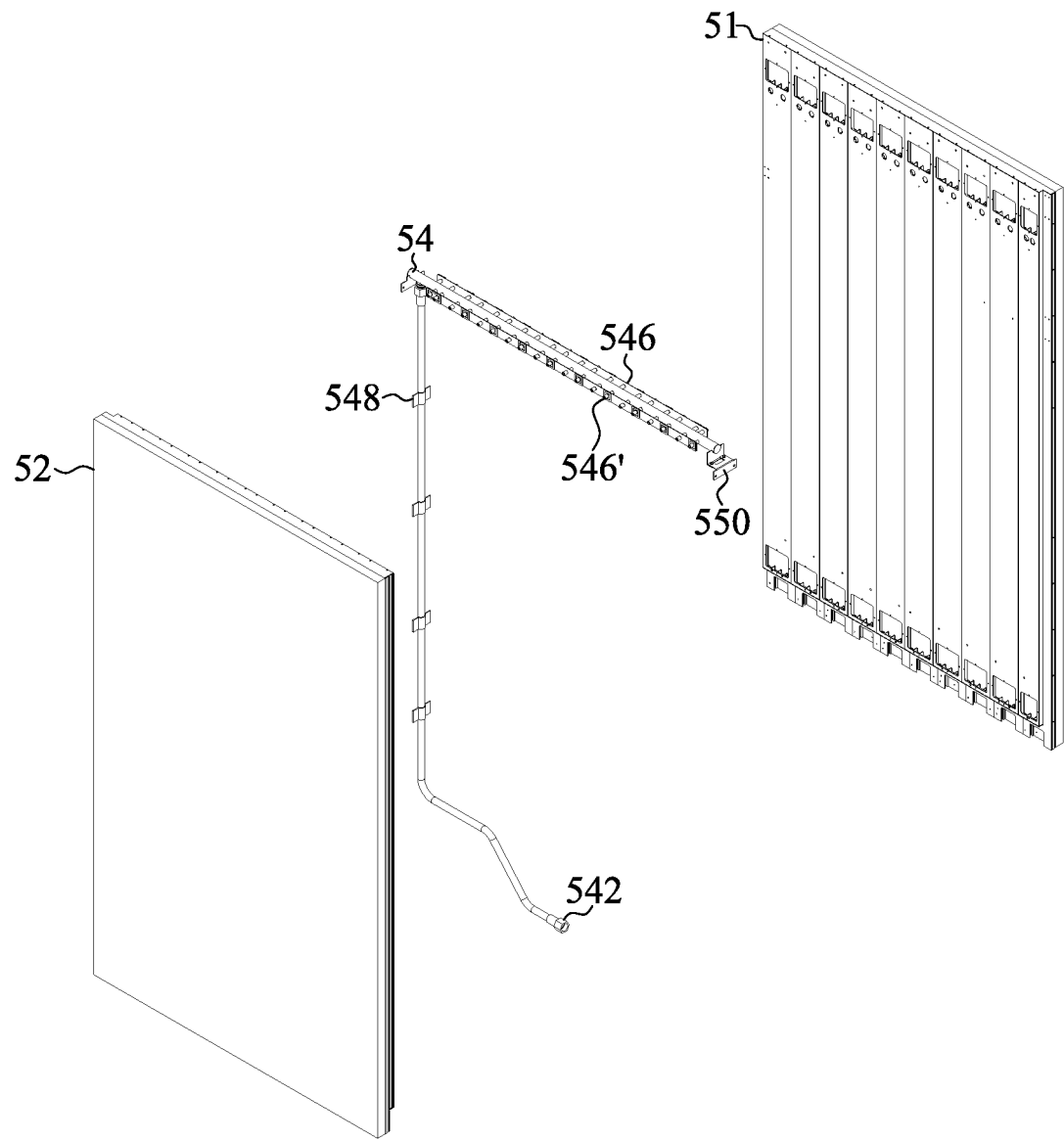
FIG. 5B is an exploded perspective view of the double-sided display apparatus of FIG. 5A.

FIG. 5A is a stereoscopic diagram of a double-sided display apparatus 5 according to some embodiments of the present disclosure. FIG. 5B is an exploded perspective view of the double-sided display apparatus 5 of FIG. 5A. Referring to FIGS. 5A and 5B, the double-sided display apparatus 5 includes a first display 51, a second display 52 and a cleaning device 54. The first display 51 includes an electronic display assembly 510 and a heat exchanger 512. The second display 52 includes an electronic display assembly 520 and a heat exchanger 522. Specifically, the cleaning device 54 is disposed between the heat exchanger 512 and the heat exchanger 522. The structures of the first display 51 are similar to that of the second display 52. The difference between them merely lies in that the display panels face in opposite directions.

The structures of the electronic display assemblies 510 and 520 of FIGS. 5A and 5B are the same or similar to the electronic display assembly 10 of FIG. 1. The structures of the heat exchangers 512 and 522 of FIGS. 5A and 5B are the same or similar to the heat exchanger 12 of FIG. 1. The structure of the cleaning device 54 of FIGS. 5A and 5B are the same or similar to the cleaning device 14 of FIG. 3A. Therefore, their detailed descriptions are not repeated here. In some embodiments, the electronic display assembly 510 and the electronic display assembly 520 can simultaneously display the same content. In some embodiments, the electronic display assembly 510 and the electronic display assembly 520 can display different image/video content.

In this embodiment, the cleaning device 54 includes a plurality of first outlets 546 on the pipe connected to the plurality of external heat dissipation pathways of the heat exchanger 512. The cleaning device 54 also includes a plurality of second outlets 546' on the pipe connected to the plurality of external heat dissipation pathways of the heat exchanger 522. The plurality of first outlets 546 and the plurality of second outlets 546' face in opposite directions. Therefore, when the cleaning fluid is released into the pipe 544, the external heat dissipation pathways of the two electronic display assemblies can be cleaned at the same time. Therefore, the required time and labor costs for cleaning the double-sided display apparatus are greatly reduced.

In light of the above, the present disclosure provides a display apparatus or a double-sided display apparatus with a cleaning device, which can effectively solve the problem of cleaning the display apparatuses placed outdoors and/or solve the problem of high temperatures within the display apparatuses to extend the life of the display apparatuses and to effectively reduce the time and labor cost required for maintenance. Accordingly, the display apparatus and the double-sided display apparatus of the present disclosure are suitable for outdoor use.

As used herein, the singular terms "a," "an," and "the" may include plural referents unless the context clearly indicates otherwise. For example, reference to an electronic device may include multiple electronic devices unless the context clearly indicates otherwise.

As used herein, the terms "connect," "connected" and "connection" refer to an operational coupling or linking. Connected components can be directly or indirectly coupled to one another through, for example, another set of components.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless otherwise specifically indicated herein, the order and grouping of the operations are not limitations of the present disclosure.

What is claimed is:

1. A display apparatus, comprising:
an electronic display assembly;
a heat exchanger comprising one or more internal heat dissipation pathways and one or more external heat dissipation pathways, wherein the one or more internal heat dissipation pathways are thermally coupled to the electronic display assembly, and the one or more internal heat dissipation pathways are thermally coupled to the one or more external heat dissipation pathways, wherein an ambient air flow passes through the one or more external heat dissipation pathways; and
a cleaning device, connected to the one or more external heat dissipation pathways, for injecting a cleaning fluid into the one or more external heat dissipation pathways,
wherein the cleaning device is disposed on a back side of the electronic display assembly opposite to a viewing side of the electronic display assembly.

2. The display apparatus of claim 1, wherein the cleaning device comprises:
an inlet for receiving the cleaning fluid;
a pipe; and
a plurality of outlets on the pipe connected to the one or more external heat dissipation pathways.

3. The display apparatus of claim 1, wherein the cleaning fluid comprises a liquid or a gas.

4. The display apparatus of claim 1, further comprising a cleaning fluid tank connected to the inlet of the cleaning device.

5. The display apparatus of claim 4, further comprising a control unit configured to release the cleaning fluid from the cleaning fluid tank to the cleaning device.

6. The display apparatus of claim 5, wherein the control unit is configured to release the cleaning fluid from the cleaning fluid tank to the cleaning device when the display apparatus is turned on.

7. The display apparatus of claim 5, wherein the control unit is configured to release the cleaning fluid from the cleaning fluid tank to the cleaning device when the display apparatus is turned off.

8. The display apparatus of claim 4, further comprising a locking accessory for mounting the cleaning device to the electronic display assembly.

9. A display apparatus, comprising:
a first electronic display assembly;
a first heat exchanger thermally coupled to the first electronic display assembly and having a first heat dissipation pathway, wherein an air flow passes through the first heat dissipation pathway; and
a cleaning device having an inlet for receiving a cleaning fluid and a pipe, connected to the first heat dissipation pathway, for injecting the cleaning fluid into the first heat dissipation pathway,
wherein the cleaning device is disposed on a back side of the first electronic display assembly opposite to a viewing side of the first electronic display assembly.

10. The display apparatus of claim 9, wherein the first heat dissipation pathway comprises a plurality of first heat dissipation pathways, and the cleaning device comprises a plurality of first outlets on the pipe connected to the plurality of first heat dissipation pathways.

11. The display apparatus of claim 9, further comprising:
a second electronic display assembly;
a second heat exchanger thermally coupled to the second electronic display assembly and having a second heat dissipation pathway;
wherein the pipe of the cleaning device is connected to the second heat dissipation pathway.

12. The display apparatus of claim 11, wherein the second heat dissipation pathway comprises a plurality of second heat dissipation pathways, and the cleaning device comprises a plurality of second outlets on the pipe connected to the plurality of second heat dissipation pathways.

13. The display apparatus of claim 11, wherein the cleaning device is disposed on a back side of the second electronic display assembly opposite to a viewing side of the second electronic display assembly.

14. The display apparatus of claim 9, wherein the cleaning fluid comprises a liquid or a gas.

15. The display apparatus of claim 9, further comprising a cleaning fluid tank connected to the inlet of the cleaning device.

16. The display apparatus of claim 15, further comprising a control unit configured to release the cleaning fluid from the cleaning fluid tank to the cleaning device.

* * * * *